(12) United States Patent
Singh et al.

(10) Patent No.: US 9,281,810 B2
(45) Date of Patent: Mar. 8, 2016

(54) CURRENT MODE LOGIC CIRCUIT WITH MULTIPLE FREQUENCY MODES

(71) Applicant: QUALCOMM Incorporated, San Diego, CA (US)

(72) Inventors: Guneet Singh, San Diego, CA (US); Hayden Clavie Cranford, Jr., Cary, NC (US); Michael Thomas Fertsch, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1 day.

(21) Appl. No.: 14/276,644

(22) Filed: May 13, 2014

(65) Prior Publication Data

US 2015/0333743 A1 Nov. 19, 2015

(51) Int. Cl.
*H03K 3/00* (2006.01)
*H03K 5/01* (2006.01)

(52) U.S. Cl.
CPC ........................................ *H03K 5/01* (2013.01)

(58) Field of Classification Search
CPC ............ H03K 5/01; H03K 5/02; H03K 5/023
USPC .................. 327/108, 109, 113, 291, 299, 563
See application file for complete search history.

(56) References Cited

U.S. PATENT DOCUMENTS

| | | | | |
|---|---|---|---|---|
| H000965 H | * | 9/1991 | Davis et al. | 330/254 |
| 5,734,272 A | * | 3/1998 | Belot et al. | 326/126 |
| 5,942,922 A | * | 8/1999 | Dinteman et al. | 327/108 |
| 6,943,588 B1 | * | 9/2005 | Luo et al. | 326/86 |
| 7,170,349 B2 | * | 1/2007 | Bhattacharjee et al. | 330/254 |
| 7,236,018 B1 | * | 6/2007 | Wang et al. | 327/108 |
| 7,279,937 B2 | * | 10/2007 | Aliahmad et al. | 326/115 |
| 7,760,115 B2 | | 7/2010 | Boomer et al. | |
| 7,961,050 B1 | * | 6/2011 | Swei et al. | 330/304 |
| 8,041,552 B2 | | 10/2011 | Pilling | |
| 8,508,304 B2 | | 8/2013 | Ravinuthula | |
| 8,578,222 B2 | | 11/2013 | Chun et al. | |
| 2006/0061415 A1 | * | 3/2006 | Bhattacharjee et al. | 327/563 |
| 2007/0016835 A1 | | 1/2007 | Hronik et al. | |
| 2009/0195288 A1 | * | 8/2009 | Chao et al. | 327/321 |
| 2012/0242418 A1 | * | 9/2012 | Takahashi | 331/109 |
| 2013/0314158 A1 | * | 11/2013 | Koba et al. | 330/254 |

* cited by examiner

*Primary Examiner* — William Hernandez
(74) *Attorney, Agent, or Firm* — Mahamedi Paradice LLP (57) ABSTRACT

A device comprising a clock circuit, a control circuit, and a current mode logic (CML) circuit is disclosed. The clock circuit provides a first differential clock signal and the control circuit generates a control signal based at least in part on the frequency of the first differential clock signal. The CML circuit generates a second differential clock signal based at least in part on the first differential clock signal. The CML circuit operates in one of a plurality of different frequency modes based at least in part on the control signal and includes a number of variable resistors that are responsive to the control signal.

19 Claims, 7 Drawing Sheets

FIG. 5

CURRENT MODE LOGIC CIRCUIT WITH MULTIPLE FREQUENCY MODES

TECHNICAL FIELD

The present embodiments relate generally to differential signaling technologies, and specifically to driving differential clock signals at different frequencies.

BACKGROUND OF RELATED ART

In serializer/deserializer (SERDES) circuits, a differential signaling scheme commonly referred to as current mode logic (CML) may be used for clock distribution in a device. A typical CML driver may receive an input differential clock signal and provide an output differential clock signal to a variety of components, such as a transmit circuit or receive circuit of the device.

CML drivers typically operate within predetermined frequency ranges. Because different devices may have different data rates and/or different clock speeds, a given CML driver may be less suitable for some devices than for other devices. Thus, it is desirable for the given CML driver to be suitable for a wide range of devices operating over a wide range of data rates and/or clock speeds.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

In accordance with the present embodiments, a device is disclosed that may maintain a signal amplitude (e.g., peak to peak voltage) of a differential clock signal at a desired voltage level for different clock frequencies. The device includes a clock circuit to provide a first differential clock signal and a control circuit to generate one or more control signals based at least in part on a frequency of the first differential clock signal. The device also includes a current mode logic (CML) circuit or clock driver to generate a second differential clock signal based at least in part on the first differential clock signal. The CML circuit may operate in one of a plurality of different frequency modes based, for example, on the one or more control signals.

In some embodiments, the CML circuit may include a differential transistor pair coupled to a first voltage supply by a pair of variable resistors and coupled to ground by a variable current source (which in turn may be coupled to a second voltage supply). The variable resistors and the variable current source may be controlled or adjusted by the one or more control signals. For example, depending on the frequency of the first differential clock signal, the one or more control signals may be used to select and/or dynamically adjust the amount of the bias current sourced by the variable current source and to select and/or dynamically adjust the resistance value of the variable resistors.

The control circuit may access a memory such as a look-up table to select the amount of the bias current for the variable current source and/or to select the resistance value for the variable resistors. The memory may include a plurality of entries corresponding to the plurality of different frequency modes. For some embodiments, each entry may store a resistance value of the variable resistors for a corresponding range of frequencies of the first differential clock signal, and may store a bias current value for the variable current source for the corresponding range of frequencies of the first differential clock signal. For at least one embodiment, one or more of the ranges of frequencies may be a specified frequency value.

For example, for a relatively low frequency mode (e.g., for frequencies less than a first threshold value), the bias current may be set to a relatively low value (e.g., to reduce power consumption), and the resistance of the variable resistors may be set to relatively high values (e.g., to offset the relatively low bias current value). For a relatively high frequency mode (e.g., for frequencies greater than a second threshold value), the bias current may be set to a relatively high value (e.g., to minimize jitter associated with higher frequency clock signals), and the resistance of the variable resistors may be set to relatively low values (e.g., to offset the relatively high bias current value). In this manner, the signal amplitude of the second differential clock signal may be maintained at a desired level for different clock frequencies so that power consumption is reduced for low frequency clock signals and jitter is minimized for high frequency clock signals. For some embodiments, the first threshold value and the second threshold value may be the same. For other embodiments, the first threshold value may be less than the second threshold value.

BRIEF DESCRIPTION OF THE DRAWINGS

The present embodiments are illustrated by way of example and are not intended to be limited by the figures of the accompanying drawings, where like reference numerals refer to corresponding parts throughout the drawing figures.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scopes all embodiments defined by the appended claims.

Figure 1:
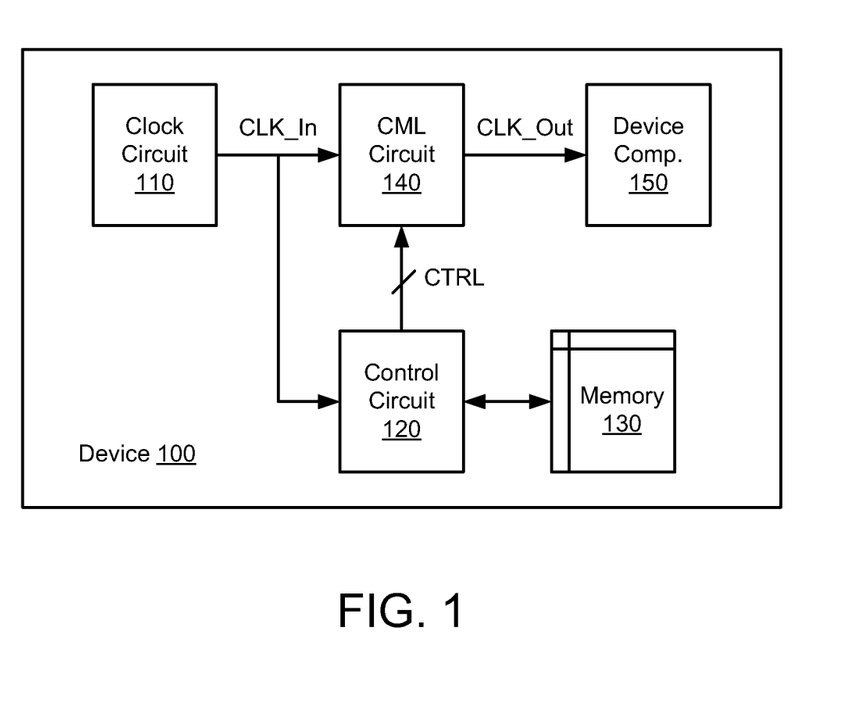
FIG. 1 is a block diagram of a device in accordance with some embodiments.

FIG. 1 is a block diagram of an example device 100 in accordance with the present embodiments. Device 100 is shown to include a clock circuit 110, a control circuit 120, a memory 130, a current mode logic (CML) circuit 140, and other device components 150. Device 100 may be any electronic device including, for example, computers, mobile phones or tablets, personal digital assistants (PDAs), set-top boxes, game consoles, switches, routers, hubs, gateways, access points, or the like.

The clock circuit 110 may include a clock generator and/or other components or circuits to produce an input differential clock signal (CLK_In). Depending on implementation, the clock circuit 110 may generate the input differential clock signal CLK_In to have different clock speeds or frequencies at different times. In some embodiments, the input differential clock signal CLK_In may be a square signal or square wave that may be provided to different electronic components of device 100, such as device components 150 (e.g., processor, memory, transmit circuit, receive circuit, etc.), for purposes of controlling and/or operating device 100. For other embodiments, the input differential clock signal CLK_In may be generated or otherwise provided by another suitable circuit, or may be received from a source external to device 100.

Although not shown for simplicity, CLK_In may be provided to device components 150 via clock buffers, distribution circuits, wiring paths, and/or other suitable circuits or components. For at least some embodiments, a signal amplitude (e.g., a peak to peak voltage) of CLK_In may be increased or decreased for purposes of providing clock signals to device components 150.

The CML circuit 140 may generate an output differential clock signal (CLK_Out) based at least in part on the input differential clock signal CLK_In. More specifically, the CML circuit 140 may receive the input differential clock signal CLK_In from the clock circuit 110 and generate the output differential clock signal CLK_Out using a number of components having variable values selected or controlled by one or more control signals (CTRL) received from or generated by the control circuit 120. For some embodiments, the CML circuit 140 may include a differential transistor pair that (1) is coupled to a voltage source by a number of variable resistors and (2) is coupled to ground by a variable current source. The resistance of the variable resistors may be selected and/or adjusted by a first of the control signals CTRL, and an amount of bias current provided by the variable current source may be selected and/or adjusted by a second of the control signals CTRL. Based at least in part on the different resistance values and the amount of bias current selected by the control signals CTRL, the CML circuit 140 may operate in any one of a plurality of different frequency modes. For at least some embodiments, selection of the one of the different frequency modes may be based upon a frequency of CLK_In.

More specifically, for some embodiments, the control circuit 120 may generate the one or more control signals CTRL based at least in part on the frequency of the input differential clock signal CLK_In. The one or more control signals CTRL may select one of the different frequency modes of operation of the CML circuit 140. Thus, for at least some embodiments, the control signals CTRL may be based at least in part on, and therefore denote, the frequency of the input differential clock signal CLK_In. In this manner, the different frequency modes, which may correspond to either specific frequency values of CLK_In or to corresponding frequency ranges of CLK_In, may select and/or adjust the resistance value of the variable resistors, and may select and/or adjust the amount of bias current provided by the variable current source. For one example, a relatively low value of the control signal may denote a relatively low value of the frequency and may select a relatively high resistance value for the variable resistors, and a relatively high value of the control signal may denote a relatively high value of the frequency and may select set a relatively low resistance value for the variable resistors. For another example, the relatively low value of the control signal may denote a relatively low value of the frequency and may select a relatively high bias current for the variable current source, and a relatively high value of the control signal may denote a relatively high value of the frequency and may select a relatively low bias current for the variable current source. For at least some embodiments, the term "relatively low frequency" may refer to frequencies that are less than a first threshold value, and the term "relatively high frequency" may refer to frequencies that are greater than a second threshold value. Further, for some embodiments, the first threshold value and the second threshold value may be the same, while for other embodiments, the first threshold value may be less than the second threshold value.

In one example, the control circuit 120 may receive the input differential clock signal CLK_In, detect the frequency of CLK_In, and access a memory 130 to select one of a plurality of different amounts of bias current for the variable current source and/or to select one of a plurality of different resistance values for the variable resistors. The control circuit 120 may provide the detected frequency of CLK_In as an input value (e.g., as a search key) to the memory 130. The memory 130 may include a number of entries corresponding to the different frequency modes. For at least some embodiments, each of the memory 130's entries may store a resistance value for the variable resistors and a bias current value for the variable current source for a corresponding frequency or range of frequencies of CLK_In. The range of frequencies may be any suitable range of frequency values. For one example, a first example range of frequencies between 0 MHz and approximately 500 MHz may denote a relatively low frequency mode and may select relatively high resistance values for the variable resistors, while a second example range of frequencies greater than approximately 500 MHz may denote a relatively high frequency mode and may select relatively low resistance values for the variable resistors. For at least some embodiments, the first range of frequencies corresponding to the relatively low frequency mode may not include a lower limit, and/or the second range of frequencies corresponding to the relatively high frequency mode may not include an upper limit. It is to be noted that the example threshold value of 500 MHz is merely illustrative, and may be lower than 500 MHZ (e.g., 400 MHz) or higher than 500 MHz (e.g., 600 MHz) or two separate thresholds to determine relatively low and relatively high frequencies. Further, for the relatively low frequency mode, the bias current may be set to a relatively low value to increase the load capacitance (e.g., to a relatively high capacitance value), and for the relatively high frequency mode, the bias current may be set to a relatively high value to reduce the load capacitance (e.g., to a relatively low capacitance value as compared to the relatively high capacitance value).

Thus, for at least some embodiments, each entry in the memory 130 may map an individual frequency of CLK_In or a range of frequencies for CLK_In to a corresponding bias current value for the variable current source and/or to a corresponding resistance value for the variable resistors. In this manner, the control circuit 120 may dynamically select and/or adjust the amount of bias current sourced by the variable current source and/or the resistance of the variable resistors based upon on the frequency of CLK_In, as explained in more detail below.

Figure 2:
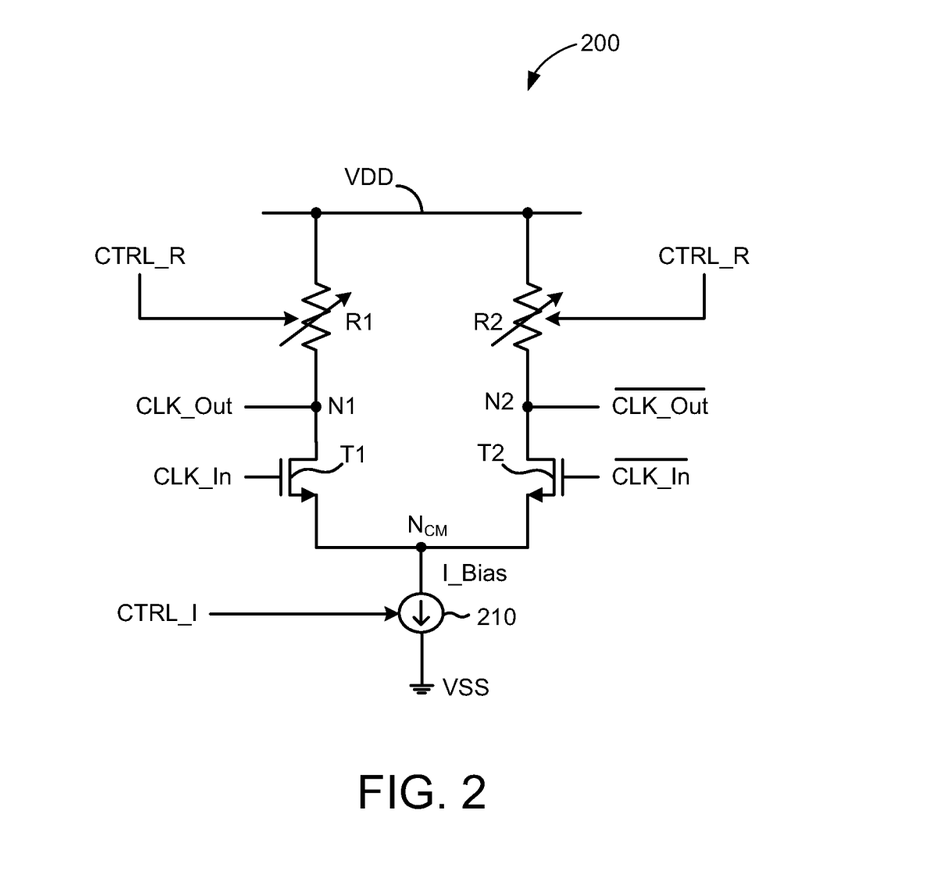
FIG. 2 is a circuit diagram of an embodiment of the current mode logic circuit of the device of FIG. 1.

FIG. 2 is a CML circuit 200 that is one embodiment of the CML circuit 140 of device 100 of FIG. 1. Circuit 200, which may operate as a common mode differential amplifier, buffer circuit, or a unity gain circuit, receives an input differential clock signal denoted by CLK_In and its logical complement $\overline{CLK\_In}$), and generates an output a differential clock signal denoted by CLK_Out and its logical complement $\overline{CLK\_Out}$).

As described in more detail below, the CML circuit 200 may operate in one of a plurality of different frequency modes to select and/or adjust the resistance values and/or the bias current values depending on the frequency of CLK_In (or alternatively some other indicator of the desired operating frequency or bandwidth of the CML circuit 200).

Circuit 200 is shown to include NMOS transistors T1 and T2, a variable current source 210 (e.g., coupled to a first voltage source or supply (VSS), and a pair of variable resistors R1 and R2. NMOS transistors T1 and T2 form a differential pair having a common mode voltage node $N_{CM}$ that biased by a bias current (I_bias). The bias current I_bias may be provided by the variable current source 210. Transistor T1 is coupled between a first output node N1 and the current source 210, and has a gate to receive CLK_In. The first variable resistor R1 is coupled between first output node N1 a second voltage source (VDD). Similarly, transistor T2 is coupled between a second output node N2 and the current source 210, and has a gate to receive $\overline{CLK\_In}$. The second variable resistor R2 is coupled between second output node N2 and VDD. In this manner, NMOS transistors T1 and T2 form a differential pair that may selectively steer the bias current through the first variable resistor R1 and/or the second variable resistor R2 to produce the output differential clock signal (CLK_Out and $\overline{CLK\_Out}$) at output nodes N1 and N2.

Each of the variable resistors R1 and R2 may include a control terminal to receive a control signal (CTRL_R) from the control circuit 120 of FIG. 1. The control signal CTRL_R, which may be one of the control signals CTRL of FIG. 1, may select or adjust the resistance value of each of the variable resistors R1 and R2, for example, based at least in part on the operating mode of circuit 200. In addition, the current source 210 may include a control terminal to receive a current control signal (CTRL_I) from the control circuit 120. The control signal CTRL_I, which may be another of the control signals CTRL of FIG. 1, may select or adjust the bias current I_Bias of the variable current source 210, for example, based at least in part on the operating mode of circuit 200.

For example, referring also to FIG. 1, when the control circuit 120 determines the frequency of the input differential clock signal, the control circuit 120 may access the memory 130 using a value based at least in part on the determined frequency in order to select one of a plurality of resistance values for the variable resistors R1 and R2 of circuit 200 and/or to select one of a plurality of bias current values for I_Bias to be provided by the variable current source 210. If the detected frequency of the input differential clock signal is a relatively low frequency, the control circuit 120 may determine that the resistance value should be set to a relatively high value and that the bias current should be set to a relatively low value. When operating in this relatively low frequency mode, the CML circuit 200 may maintain the signal amplitude (e.g., the peak to peak voltage) of the output differential clock signal at a desired voltage level or threshold consistent with the relatively low frequency of CLK_In. In addition, by setting the bias current to be relatively low, power consumption of circuit 200 may be reduced or minimized as compared to a higher bias current. The control circuit 120 may provide respective CTRL_R and CTRL_I control signals to the components of circuit 200 in order to cause circuit 200 to operate in the relatively low frequency mode.

Conversely, if the detected frequency of the input differential clock signal is a relatively high frequency, the control circuit 120 may determine that the resistance value should be set to a relatively low value and that the bias current should be set to a relatively high value. For a relatively high frequency, by setting the bias current to be relatively high, jitter associated with higher frequency clock signals may be minimized in circuit 200.

Although circuit 200 is shown to include NMOS transistors T1 and T2, the current source 210, and the variable resistors R1 and R2, for other embodiments, circuit 200 may include additional variable resistors (e.g., in series and/or in parallel with the variable resistors R1 and R2), additional transistors in different arrangements, and/or other components for driving the input differential clock signal for use with other device components.

Figure 3:
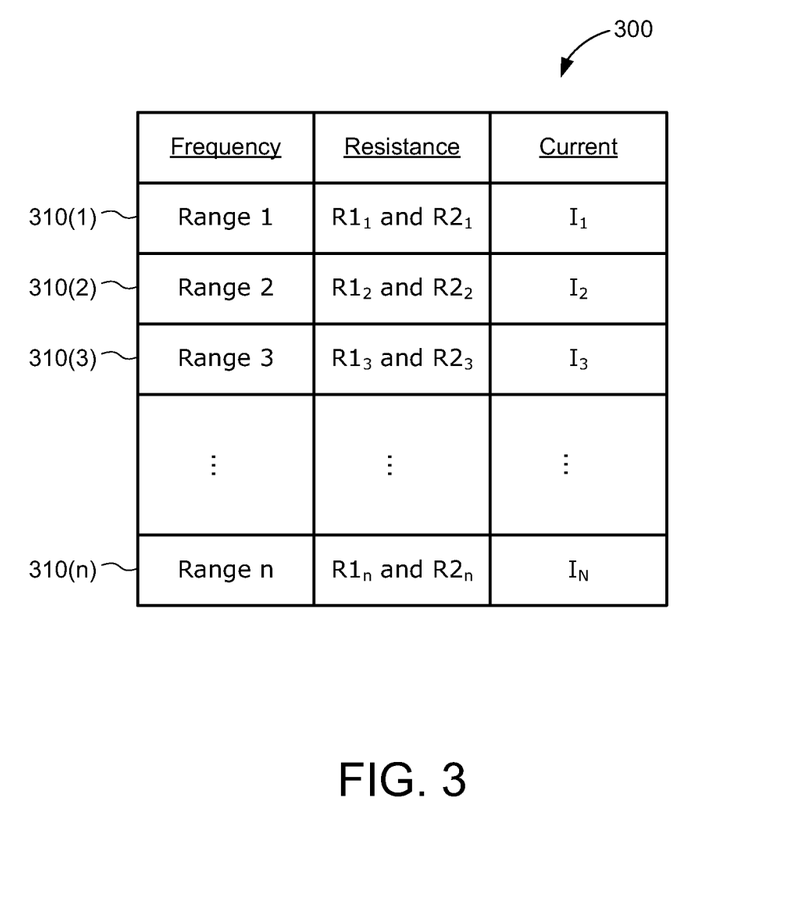
FIG. 3 is an illustrative table in accordance with some embodiments.

FIG. 3 is memory 300 that is one embodiment of the memory 130 of device 100 of FIG. 1. Memory 300 may include a plurality of entries 310(1)-310(n) each corresponding to one of a plurality of different frequency modes of the CML circuit 140. Memory 300 may map a range of clock frequencies with corresponding resistance values for variable resistors R1-R2 and/or with a corresponding bias current for the variable current source 210. For example, entry 310(1) may correspond to (or store) a first frequency range (Range 1) and store a first resistance value $R1_1$ for variable resistor R1, a first resistance value $R2_1$ for variable resistor R2, and a first bias current value $I_1$ for variable current source 210; entry 310(2) may correspond to (or store) a second frequency range (Range 2) and store a second resistance value $R1_2$ for variable resistor R1, a second resistance value $R2_2$ for variable resistor R2, and a second bias current value $I_2$ for variable current source 210, and so on. Thus, each of the frequency ranges stored in the memory 300 may correspond to a respective one of the plurality of different frequency modes.

For each clock frequency mode, the corresponding resistance value and the bias current value may be selected based at least in part on a predetermined voltage level or voltage threshold. For example, the resistance value and the bias current value may be selected for individual frequency modes such that the signal amplitude of the output differential clock signal may be maintained at the desired voltage level (or within a designated percentage of the desired voltage level) regardless of the frequency of the input differential clock signal.

Referring also to FIG. 1, the control circuit 120 may determine the frequency of the input differential clock signal and access memory 300 (e.g., perform a look-up operation) to select the corresponding resistance value for variable resistors R1-R2 and to select the corresponding bias current value for the variable current source 210. For example, if the detected frequency of the input differential clock signal falls within the third frequency range (Range 3), the control circuit 120 may access entry 310(3) of memory 300 and select resistance value $R1_3$ for variable resistor R1, select resistance value $R2_3$ for variable resistor R2, and select bias current value $I_3$ for the variable current source 210. The control circuit 120 may embody the selected resistance and/or bias current values within the one or more control signals CTRL, and then provide the one or more control signals CTRL to the variable resistors R1-R2 and to the variable current source 210. In this manner, the control signals CTRL may set the variable resistors R1-R2 to the selected resistance values, and may set the variable current source 210 to provide the selected bias current.

For at least some embodiments, one or more of entries 310(1)-310(n) may correspond to or store specific frequencies (e.g., rather than frequency ranges). Thus, for these at least some embodiments, one or more of the frequency ranges associated with memory 300 may denote a specific frequency of the input differential clock signal.

For other embodiments, one or more of entries 310(1)-310(n) of memory 300 may be associated with a jitter budget for device 100, for example, to minimize jitter in the output differential clock signal. The jitter budget may vary depending on device 100, components within device 100, the arrangement and connection of the components within device 100, etc. For individual frequency modes, the corresponding resistance value and the corresponding bias current value may be determined to facilitate optimum clock power (and performance) with respect to jitter.

Figure 4A:
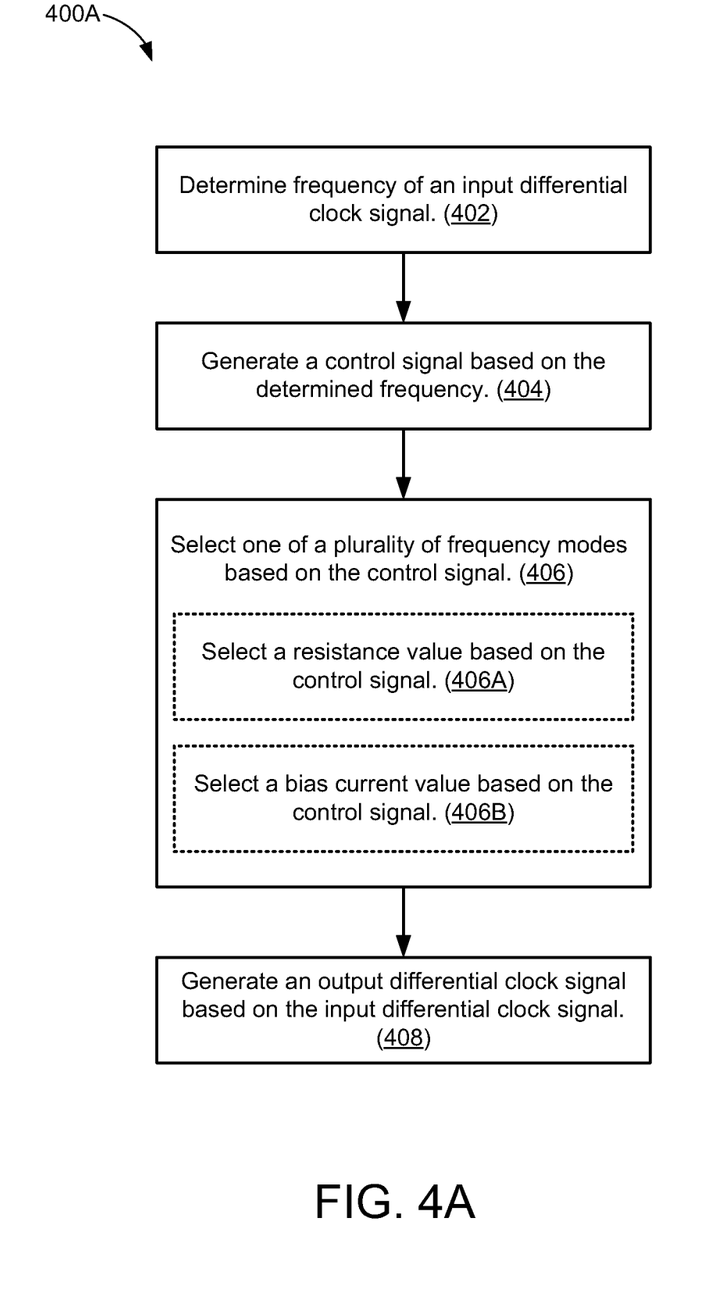
FIGS. 4A-4C are illustrative flow charts depicting example operations for controlling the current mode logic circuit of the device of FIG. 1 in accordance with some embodiments.

FIG. 4A is an illustrative flow chart depicting an example operation 400A of device 100 in accordance with the present embodiments. As described above, the present embodiments may allow device 100 to maintain a signal amplitude of a differential clock signal at a desired voltage level for different clock frequencies, and may operate the CML circuit 140 of device 100 in one of a plurality of different frequency modes.

Referring also to FIG. 1, for some embodiments, the control circuit 120 determines the frequency of the input differential clock signal (402). The input differential clock signal may be generated by the clock circuit 110. For example, the control circuit 120 may receive the input differential clock signal and include a frequency detect circuit to detect the frequency of the input differential clock signal. Then, the control circuit 120 may generate one or more control signals (CTRL) based at least in part on the determined frequency (404). Then, the control circuit 120 may select one of a plurality of frequency modes based at least in part on the control signals (406). More specifically, the control circuit 120 may select a resistance value for the variable resistors R1 and R2 based at least in part on the control signals (or based at least in part on the determined frequency) (406A), and may select a bias current value for the variable current source 210 based at least in part on the control signals (406B). Thereafter, the CML circuit 140 may generate the output differential clock signal based at least in part on the input differential clock signal (408).

As described above, the control circuit 120 may use the frequency value as an input (e.g., a search key to the memory 130) to select the resistance values for variable resistors R1-R2 and the bias current value for the variable current source 210 based at least in part on the determined frequency mode of device 100. For some embodiments, memory 300 may be a content addressable memory (CAM), a ternary CAM (TCAM), or a quaternary CAM, although other types of storage devices may be used for memory 300.

Figure 4B:
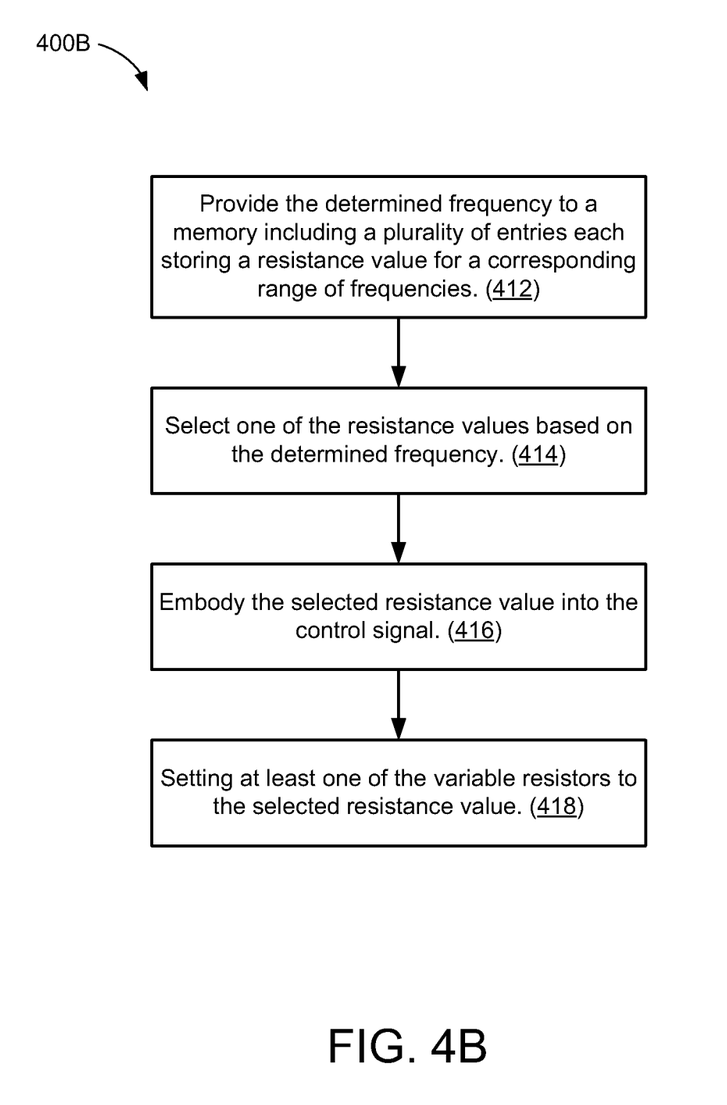

FIG. 4B is an illustrative flow chart depicting an example operation 400B of device 100 selecting a resistance value from memory 300, in accordance with some embodiments. First, the control circuit 120 provides the determined frequency to memory 300, which includes a plurality of entries 310(1)-310(n) each storing a resistance value for a corresponding range of frequencies (412). Then, the control circuit 120 selects one of the resistance values based at least in part on the determined frequency (414). Then, the control circuit 120 may embody the selected resistance value into the control signals CTRL (416), and may set at least one of the variable resistors R1 or R2 to the selected resistance value (418).

Figure 4C:
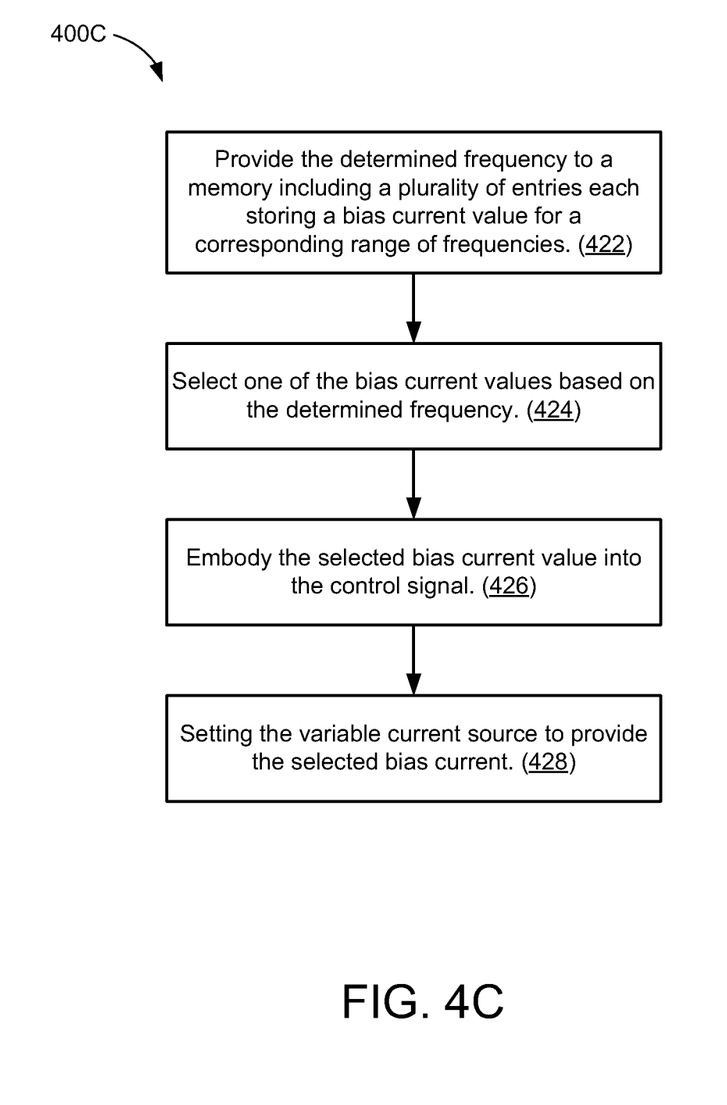

FIG. 4C is an illustrative flow chart depicting an example operation 400C of device 100 selecting a bias current value from memory 300, in accordance with some embodiments. First, the control circuit 120 provides the determined frequency to memory 300, which includes a plurality of entries 310(1)-310(n) each storing a bias current value for a corresponding range of frequencies (422). Then, the control circuit 120 selects one of the bias current values based at least in part on the determined frequency (424). Then, the control circuit 120 may embody the selected bias current value into the control signals CTRL (426), and may set the variable current source 210 to output the selected bias current vale (428).

As described above, the CML circuit 140 may operate in one of a plurality of different frequency modes. For example, if the detected frequency of the input differential clock signal is relatively low, the control circuit 120 may provide a first set of control signals that is indicative of a relatively low value of the detected frequency to the CML circuit 140. The first set of control signals may set the resistance of the variable resistors R1 and R2 to a relatively high resistance, and may set the bias current of the variable current source 210 to a relatively low value. Conversely, if the detected frequency of the input differential clock signal is relatively high, the control circuit 120 may provide a second set of control signals that is indicative of a relatively high value of the detected frequency to the CML circuit 140. The second set of control signals may set the resistance of the variable resistors R1 and R2 to a relatively low resistance, and may set the bias current of the variable current source 210 to a relatively high value.

The control circuit 120 may continually or periodically detect or determine the frequency of the input differential clock signal, and in response thereto may selectively adjust the frequency mode of the device 100. In this manner, when the clock circuit 110 changes the frequency of the input differential clock signal (e.g., for purposes of operating device 100 or device components 150), the control circuit 120 may dynamically adjust the control signal(s) CTRL provided to the CML circuit 140, for example, so that the CML circuit 140 may dynamically switch between frequency modes.

Figure 5:
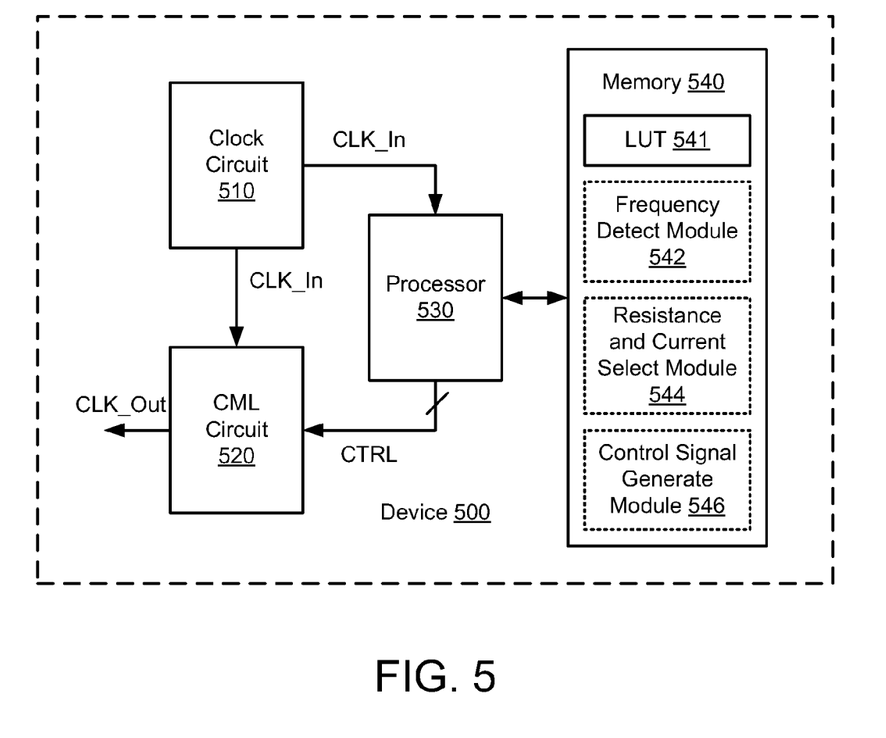
FIG. 5 is another block diagram of a device in accordance with at least one embodiment.

FIG. 5 is a block diagram of a device 500 that is another embodiment of the device 100 of FIG. 1. Device 500 is shown to include a clock circuit 510, a current mode logic (CML) circuit 520, a processor 530, and a memory 540. The clock circuit 510 may generate the input differential clock signal CLK_In. The CML circuit 520 may receive the input differential clock signal CLK_In, and generate an output differential clock signal CLK_Out based at least in part on CLK_In. For example, the CML circuit 520 may be a CML driver that adjusts the signal amplitude of CLK_In to generate an output signal CLK_Out having a different signal amplitude than CLK_In. In one example, the CML circuit 520 may include a differential transistor pair that is coupled to a voltage source by a number of variable resistors and that is coupled to ground by a variable current source.

Processor 530, which is coupled to the clock circuit 510, the CML circuit 520, and the memory 540, may be any suitable processor capable of executing scripts or instructions stored in device 500 (e.g., within the memory 540). In one embodiment, the processor 530 may execute instructions stored in the memory 540 to determine the frequency of the input differential clock signal CLK_In, select the corresponding resistance value of a number of variable resistors (e.g., resistors R1 and R2), select the corresponding bias current value for the variable current source 210, and generate control signals to control the variable resistors R1 and R2 and current source 210.

For the example embodiment of FIG. 5, device 500 may not include the control circuit 120 of FIG. 1. Instead, the processor 530 may execute instructions stored in the memory 540 to perform the functions of the control circuit 120. The memory 500 may include a look-up table (LUT) 541 that is one embodiment of memory 130 of FIG. 1. The memory 540 may also include a non-transitory computer-readable medium (e.g., one or more nonvolatile memory elements, such as EPROM, EEPROM, Flash memory, a hard drive, and so on) that may store the following software modules:

- a frequency detect module 542 to determine the frequency of the input differential clock signal;
- a resistance and current (R and I) select module 544 to select, based at least in part on the determined frequency, the corresponding resistance value of the variable resistors R1 and R2 and the corresponding bias current value of the variable current source 210; and
- a control signal generate module 546 to generate one or more control signals to cause the variable resistors R1 and R2 and the variable current source 210 to be adjusted to the determined respective values.

Each software module may include instructions that, when executed by the processor 530, may cause device 500 to perform the corresponding function. Thus, the non-transitory computer-readable storage medium of the memory 540 may include instructions for performing all or a portion of the operations described above with respect to FIGS. 4A-4C.

The processor 530, which is coupled to the clock circuit 510, the CML circuit 520, and the memory 540, may execute scripts or instructions stored within the memory 540 to control the variable components of the CML circuit 520. For example, the processor 540 may execute the frequency detect module 542, the resistance and current select module 544, and the control signal generate module 546.

In some embodiments, the frequency detect module 542 may be executed by the processor 530 to detect the frequency of the input differential clock signal CLK_In. For example, the processor 530 may receive the input differential clock signal CLK_In, and execute the frequency detect module 542 to determine the clock frequency of CLK_In. According to some embodiments, executing the frequency detect module 542 may cause the processor 530 to communicate with other circuits or components of device 500, such as a frequency detect circuit (not shown in FIG. 5), in order to determine the frequency of the input differential clock signal, CLK_In.

The resistance and current select module 544 may be executed by the processor 530 to select the resistance value of the variable resistors R1 and R2 and the bias current value of the variable current source 210. The processor 530 may execute the resistance and current select module 544 to access LUT 541 using the determined frequency of the input differential clock signal. The LUT 541 includes a plurality of entries that each corresponds to a different frequency mode, as described above. The processor 530 may select the resistance value and the bias current value based at least in part on the determined frequency.

The control signal generate module 546 may be executed by the processor 530 to generate the one or more control signals CTRL for the CML circuit 520. For example, a first control signal may be generated to adjust the resistance of the variable resistors R1 and R2 to the selected resistance value. Similarly, a second control signal may be generated to adjust the bias current of the variable current source 210 to the selected bias current amount. In this manner, the control signals may cause the CML circuit 520 to operate in a specific frequency mode based at least in part on the frequency of the input differential clock signal CLK_In, and generate an output differential clock signal CLK_Out for device 500. Other electronic components of device 500 (not shown in FIG. 5) may use the output differential clock signal CLK_Out for purposes of controlling and operating device 500.

In one embodiment, the processor 530 may also execute a clock monitor module (not shown in FIG. 5) stored in the memory 540 to monitor the output differential clock signal CLK_Out (e.g., such as the frequency or signal amplitude of CLK_Out). Based at least in part on the information determined from monitoring CLK_Out, the processor 530 may update one or more entries of the LUT 541 as necessary (e.g., to change the desired voltage level of the signal amplitude, to optimize for changes in jitter in device 500, etc.). In another embodiment, the memory may be accessible by a user of device 100 and may be user-configurable.

In the foregoing specification, the present embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense. For example, the method depicted in the flow chart of FIGS. 4A-4C may be performed in other suitable orders and/or one or more method steps may be omitted.

What is claimed is:

1. A device, comprising:
    a clock circuit to provide a first differential clock signal;
    a control circuit to generate a control signal based at least in part on a frequency of the first differential clock signal; and
    a current mode logic (CML) circuit, including a pair of differential transistors, to generate a second differential clock signal based at least in part on the first differential clock signal and to operate in one of a plurality of different frequency modes based at least in part on the control signal.

2. The device of claim 1, wherein:
    the CML circuit includes a number of variable resistors coupled to the pair of differential transistors and responsive to the control signal; and
    the CML circuit includes a variable current source coupled to the pair of differential transistors and responsive to the control signal.

3. The device of claim 2, wherein a relatively low value of the control signal denotes a relatively low value of the frequency and is to set a relatively high resistance value for the variable resistors, and a relatively high value of the control signal denotes a relatively high value of the frequency and is to set a relatively low resistance value for the variable resistors.

4. The device of claim 2, wherein a relatively low value of the control signal denotes a relatively low value of the frequency and is to select a relatively low bias current for the variable current source, and a relatively high value of the control signal denotes a relatively high value of the frequency and is to select a relatively high bias current for the variable current source.

5. The device of claim 2, further comprising:
    a memory including a plurality of entries corresponding to the plurality of different frequency modes, wherein each entry stores a resistance value of the variable resistors for a corresponding range of frequencies of the first differential clock signal.

6. The device of claim 5, wherein each entry of the memory stores a bias current value for the variable current source for the corresponding range of frequencies of the first differential clock signal.

7. The device of claim 6, wherein at least one of the ranges comprises a specific frequency value.

8. The device of claim 5, wherein the control circuit is to generate the control signal by accessing the memory.

9. A current mode logic (CML) circuit to generate an output differential clock signal based at least in part on an input differential clock signal, the CML circuit comprising:
   a variable current source coupled to a first voltage supply and including a control terminal to receive a control signal denoting a frequency of the input differential clock signal;
   a pair of transistors coupled to the variable current source and responsive to the input differential clock signal; and
   a pair of variable resistors coupled between the pair of transistors and a second voltage supply, wherein each of the variable resistors includes a control terminal to receive the control signal,
   wherein the CML circuit is coupled to a control circuit, the control circuit to generate the control signal based at least in part on the frequency of the input differential clock signal.

10. The CML circuit of claim 9, wherein the CML circuit is to operate in a selected one of a plurality of different frequency modes based at least in part on the control signal.

11. The CML circuit of claim 9, wherein the control circuit is coupled to a memory including a plurality of entries corresponding to a plurality of different frequency modes, wherein each entry stores a selected resistance value of the variable resistors for a corresponding range of frequencies of the input differential clock signal.

12. The CML circuit of claim 9, wherein the control circuit is coupled to a memory including a plurality of entries corresponding to a plurality of different frequency modes, wherein each entry stores a selected bias current value for the variable current source for a corresponding range of frequencies of the input differential clock signal.

13. In a device comprising a current mode logic (CML) circuit including a differential transistor pair coupled to a number of variable resistors and to a variable current source, a method comprising:
   determining a frequency of an input differential clock signal;
   generating a control signal based at least in part on the determined frequency;
   selecting one of a plurality of different frequency modes based at least in part on the control signal; and
   generating an output differential clock signal based at least in part on the input differential clock signal.

14. The method of claim 13, wherein the selecting comprises:
   selecting one of a plurality of resistance values for the variable resistors; and
   selecting one of a plurality of bias current values for the variable current source.

15. The method of claim 14, wherein selecting the resistance value and selecting the bias current value comprises:
   accessing a memory including a plurality of entries, each entry storing a selected resistance value and a selected bias current value for a corresponding one of the plurality of different frequency modes.

16. The method of claim 13, wherein the selecting comprises:
   providing the determined frequency to a memory including a plurality of entries each storing a resistance value for a corresponding range of frequencies;
   selecting one of the resistance values based at least in part on the determined frequency;
   embodying the selected resistance value into the control signal; and
   setting at least one of the variable resistors to the selected resistance value.

17. The method of claim 13, wherein the selecting comprises:
   providing the determined frequency to a memory including a plurality of entries each storing a bias current value for a corresponding range of frequencies;
   selecting one of the bias current values based at least in part on the determined frequency;
   embodying the selected bias current value into the control signal; and
   setting the variable current source to provide the selected bias current.

18. The method of claim 13, wherein a relatively low value of the control signal denotes a relatively low value of the determined frequency and selects a relatively high resistance value for the variable resistors, and a relatively high value of the control signal denotes a relatively high value of the determined frequency and selects a relatively low resistance value for the variable resistors.

19. The method of claim 13, wherein a relatively low value of the control signal denotes a relatively low value of the determined frequency and selects a relatively high bias current value for the variable current source, and a relatively high value of the control signal denotes a relatively high value of the determined frequency and selects a relatively low bias current value for the variable current source.

* * * * *